US008463983B2

(12) United States Patent
Eleftheriou et al.

(10) Patent No.: US 8,463,983 B2
(45) Date of Patent: Jun. 11, 2013

(54) CONTAINER MARKER SCHEME FOR REDUCING WRITE AMPLIFICATION IN SOLID STATE DEVICES

(75) Inventors: Evangelos S. Eleftheriou, Ruschlikon (CH); Robert Haas, Ruschlikon (CH); Xiaoyu Hu, Ruschlikon (CH)

(73) Assignee: International Business Machines Corporation, Armonk, NY (US)

( * ) Notice: Subject to any disclaimer, the term of this patent is extended or adjusted under 35 U.S.C. 154(b) by 788 days.

(21) Appl. No.: 12/559,959

(22) Filed: Sep. 15, 2009

(65) Prior Publication Data
US 2011/0066788 A1 Mar. 17, 2011

(51) Int. Cl.
*G06F 12/00* (2006.01)
(52) U.S. Cl.
USPC .................... 711/103; 711/105; 711/E12.008
(58) Field of Classification Search
USPC .................................................. 711/103, 105
See application file for complete search history.

(56) References Cited

U.S. PATENT DOCUMENTS

| 6,732,221 | B2 | 5/2004 | Ban |
| 7,254,668 | B1 | 8/2007 | Chang et al. |
| 7,356,641 | B2 | 4/2008 | Venkiteswaran |
| 7,424,587 | B2 | 9/2008 | Caulkins et al. |
| 7,516,295 | B2 | 4/2009 | In et al. |
| 2004/0080985 | A1 * | 4/2004 | Chang et al. ............. 365/185.33 |
| 2005/0050261 | A1 | 3/2005 | Roehr et al. |
| 2005/0204187 | A1 * | 9/2005 | Lee et al. ........................... 714/8 |
| 2007/0061502 | A1 | 3/2007 | Lasser et al. |
| 2008/0147968 | A1 | 6/2008 | Lee et al. |
| 2008/0155183 | A1 | 6/2008 | Zhuang et al. |
| 2008/0209112 | A1 | 8/2008 | Yu et al. |
| 2008/0266962 | A1 | 10/2008 | Jeon et al. |
| 2008/0313505 | A1 | 12/2008 | Lee et al. |
| 2009/0031076 | A1 | 1/2009 | In et al. |
| 2009/0094406 | A1 | 4/2009 | Ashwood |
| 2009/0094409 | A1 | 4/2009 | Yeh et al. |
| 2009/0109787 | A1 | 4/2009 | Rao |
| 2009/0113121 | A1 | 4/2009 | Lee et al. |
| 2009/0164702 | A1 * | 6/2009 | Kern ............................. 711/103 |

FOREIGN PATENT DOCUMENTS

| EP | 0863513 | * | 9/1998 |
| EP | 1282040 A2 | | 5/2003 |
| WO | 2005022550 A1 | | 3/2005 |

OTHER PUBLICATIONS

A. Gupta et al., "DFTL: A Flash Translation Layer Employing Demand-based Selective Caching of Page-level Address Mappings", pp. 1-12; Department of Computer Science and Engineeering; The Pennsylvania State University, University Park, PA 16802 USA; Mar. 7-11, 2009.
C. Wu, et al., "A Space-Efficient Caching Mechanism for Flash-Memory Address Translation", pp. 1-8, IEEE Computer Society; National Taiwan University, Taipei, Taiwan, ROC 2006.

(Continued)

*Primary Examiner* — Reginald Bragdon
*Assistant Examiner* — Aracelis Ruiz
(74) *Attorney, Agent, or Firm* — Cantor Colburn LLP; Daniel Morris

(57) ABSTRACT

A solid state storage device and method are provided. Multiple blocks are configured as storage memory for a solid state storage device, and each block includes multiple pages. A controller is configured to operate the solid state storage device. A free block of the multiple blocks is assigned a marker level by the controller. For a particular page of the multiple pages, each particular page of data is written to a block of the multiple blocks with a marker level corresponding to a level of dynamicity calculated by the controller for that particular page.

24 Claims, 8 Drawing Sheets

OTHER PUBLICATIONS

D. Du et al., "Overview of SSD Related Projects", pp. 1-116; DTC DISC, Intelligent Storage Consortium; DISC Members' Day Oct. 30, 2008.

D. Narayanan et al., "Migrating Enterprise Storage to SSDs: Analysis of Tradeoffs", pp. 1-12; Microsoft Research Ltd. Technical Report MSR-TR-2008-169, Nov. 2008; Microsoft Research Cambridge, UK.

E. Spanjer, "Flash Management—Why and How? A detailed overview of flash management techniques", pp. 1-17, Adtron Corporation Apr. 2008.

H. Kim et al., "BPLRU: A Buffer Management Scheme for Improving Random Writes in Flash Storage," Software Laboratory of Samsung Electronics, Korea; pp. 239-252; FAST '08: 6th USENIX Conference on File and Storage Technologies, USENIX Association.

J. Davis et al., "FRP: A Nonvolatile Memory Research Platform Targeting NAND Flash", pp. 1-8; Microsoft Research—Silicon Valley Lab 2009.

J. Hesieh et al., "Efficient On-Line Identification of Hot Data for Flash-Memory Management", Department of Computer Science and Information Engineering National Taiwan University Taipai, Taiwan 106, R.O.C.; SAC'05 Mar. 13-17, 2005, Santa Fe, New Mexico, USA, pp. 1-5.

J. Hsieh et al., "Configurable Flash-Memory Management: Performance versus Overhaeds", pp. 1571-1583; IEEE Computer Society 2008; National Taiwan University of Science and Technology, Taipei, Taiwan.

K. Greenan et al., "Building Flexilbe, Fault-Tolerant Flash-Based Storage Systems", pp. 1-6, Univ. of California, Santa Cruz 2008; Santa Clara University.

N. Agrawal et al. "Design Tradeoffs for SSD Performance", Microsoft Research, Silicon Valley, University of Wisconsin-Madison, pp. 1-14 Jul. 2009.

S. Lee et al., "Buffer-Aware Garbage Collection for NAND Flash Memory-Based Storage Systems", pp. 1-6; School of Computer Science and Engineering, Seoul National University, Seoul, Korea 2008.

E Gal et al., "Algorithms and Data Structures for Flash Memories", pp. 138-163, School of Computer Science, Tel-Aviv University; ACM Computing Surveys (CSUR) Surveys Homepagearchive; vol. 37 Issue 2, Jun. 2005.

\* cited by examiner

CONTAINER MARKER SCHEME FOR REDUCING WRITE AMPLIFICATION IN SOLID STATE DEVICES

BACKGROUND

Exemplary embodiments relate to solid state devices, and more specifically, to a data placement, garbage collection and wear leveling scheme for solid state storage devices.

Solid-state drive (SSD) devices, for example NAND flash memories, are capable of providing 10-100 times performance improvement compared with traditional hard disk drives (HDDs). In a typical organization, NAND flash memory is organized in terms of blocks, and each block typically includes 64 data pages, 4 KB each. Reads and writes are processed in terms of pages. A data page has to be erased before data can be written on it.

Because of the special characteristics of flash memory, one of the issues facing solid state drive design is write amplification. Flash memory must be erased before it can be re-used for writes, and the erase operation is on a block basis while the write is operating on a much smaller data page level. Before a block can be erased, all valid data pages on that block must be relocated to other locations, which leads to write amplification. The effect of write amplification can be reduced by over-provisioning, namely only a portion of the raw flash memory space is exposed to user space. Over-provisioning leads to higher cost.

SUMMARY

According to one exemplary embodiment, a solid state storage device is provided. Multiple blocks are configured as storage memory for a solid state storage device, and each block includes multiple pages. A controller is configured to operate the solid state storage device. Each free block of the multiple blocks is assigned a marker level by the controller before it is written, and particularly blocks with a lower program/erase cycles, or equivalently with a long remaining endurance lifetime are assigned a marker indicating high dynamicity, and vice versa, for the purpose of wear leveling. For a particular page of the multiple pages, each particular page of data is written to a block of the multiple blocks with a marker level corresponding to a level of dynamicity calculated by the controller for that particular page.

According to one exemplary embodiment, a solid state storage device is provided. Multiple blocks are configured as storage memory for the solid state storage device. A controller is configured to operate the solid state storage device. When writing data addressed to a logical block address, the controller is operative to determine a current marker level for the logical block address by increasing 1 or more on its previous marker level, and write the data to a free block of the multiple blocks, which has the same marker level.

According to one exemplary embodiment, a solid state storage device is provided. Multiple blocks are configured as memory for the solid state storage device, and a controller is configured to operate the solid state device. When performing a write request to relocate valid data pages of a block of the multiple blocks, the controller is operative to determine a current marker level for the block of the multiple blocks by decreasing 1 or more on its previous marker level, and write the valid data pages to a free block of the plurality of blocks, which has the same marker level.

According to one exemplary embodiment, a solid state storage device is provided. Multiple blocks are configured as memory for the solid state storage device, and a controller is configured to operate the solid state device. With the algorithm described above, every block with written data has a container marker level, with the level indicating the dynamic-static level of all the data pages on that block. The algorithm and the corresponding data placement enables data pages with similar update frequency to be placed on the same block, thereby reducing write amplification according.

According to one exemplary embodiment, a solid state storage device is provided. Multiple blocks are configured as memory for the solid state storage device, and a controller is configured to operate the solid state device. The controller estimates the dynamic-static level of every data page to be written by determining its current container marker, and store highly dynamic data pages onto a DRAM cache instead of on flash blocks.

According to one exemplary embodiment, a solid state storage device is provided. Multiple blocks are configured as memory for the solid state storage device, and a controller is configured to operate the solid state device. The controller estimates the dynamic-static level of every data page to be written by determining its current container marker, and store highly dynamic data pages onto MRAM or FeRAM instead of on flash blocks.

Additional features are realized through the techniques of the present disclosure. Other systems, methods, apparatus, and/or computer program products according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features of the present disclosure are apparent from the following detailed description taken in conjunction with the accompanying drawings in which:

DETAILED DESCRIPTION

Exemplary embodiments provide a data placement scheme called container marker, which can improve the efficiency of garbage collection and wear leveling which eventually leads to write reduction. A container marker is an indicator of how frequently a data page is updated or changed. Exemplary embodiments provide an algorithm, e.g., implemented in a controller, to adaptively estimate the dynamic level of data pages, and the controller can group and place data pages of the same dynamic level into blocks marked with the corresponding container marker. Particularly blocks with a lower program/erase cycles, or equivalently with a long remaining endurance lifetime are assigned a marker indicating high dynamicity, and vice versa, for the purpose of wear leveling.

Exemplary embodiments disclose a mechanism, e.g., the controller, to estimate the dynamic and/or static level of how frequently a data page is being updated, and consequently, place data pages into a solid state storage device (e.g., flash memory) according to the dynamic/static level. Further, exemplary embodiments may store most frequently updated pages into a dynamic random access memory (DRAM) based write cache, to further reduce actual writes onto flash memories.

Exemplary embodiments may be implemented where flash memory uses relocate-on-write (also called out-of-place write), because if write-in-place is used instead, flash memory can exhibit high latency due to the necessary reading, erasing, and reprogramming (writing) of the entire block in which data is being updated. The management of out-of-place updates involves a mapping between logical block addresses (LBA) that are assigned to each user page write, and physical block addresses (PBA) which are the physical page addresses in flash memory. Relocate-on-write necessitates a garbage-collection process, which can result in additional read and write operations. The policy used in garbage-collection to select a block to recycle is called garbage-collection policy. Garbage collection typically leads to write amplification.

Figure 1:
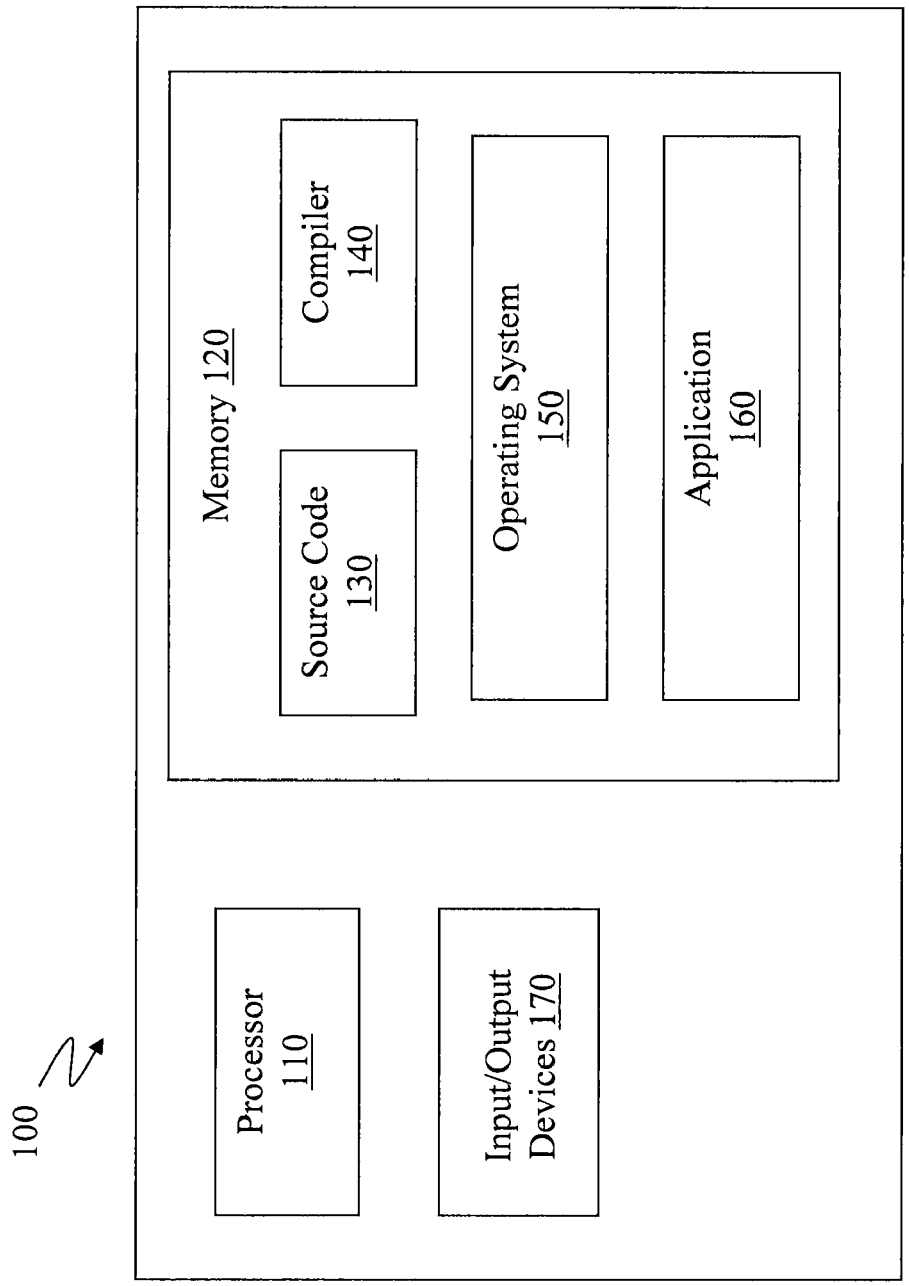
FIG. 1 illustrates an example of a computer having capabilities, which may be included in exemplary embodiments.

FIG. 1 illustrates an example of a computer 100 having capabilities, which may be included in exemplary embodiments. Various methods, procedures, modules, flow diagrams, controllers, techniques, etc., discussed herein may also incorporate and/or utilize the capabilities of the computer 100. One or more of the capabilities of the computer 100 may be implemented in any element discussed herein.

Generally, in terms of hardware architecture, the computer 100 may include one or more processors 110, computer readable memory 120, and one or more input and/or output (I/O) devices 170 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 110 is a hardware device for executing software that can be stored in the memory 120. The processor 110 can be virtually any custom made or commercially available processor, a central processing unit (CPU), a data signal processor (DSP), or an auxiliary processor among several processors associated with the computer 100, and the processor 110 may be a semiconductor based microprocessor (in the form of a microchip) or a macroprocessor.

The computer readable memory 120 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CDROM), flash memory, disk, diskette, cartridge, cassette or the like, etc.). Moreover, the memory 120 may incorporate electronic, magnetic, optical, and/or other types of storage media. Note that the memory 120 can have a distributed architecture, where various components are situated remote from one another, but can be accessed by the processor 110.

The software in the computer readable memory 120 may include one or more separate programs, each of which comprises an ordered listing of executable instructions for implementing logical functions. The software in the memory 120 includes a suitable operating system (O/S) 150, compiler 140, source code 130, and one or more applications 160 of the exemplary embodiments. As illustrated, the application 160 comprises numerous functional components for implementing the features, processes, methods, functions, and operations of the exemplary embodiments. The application 160 of the computer 100 may represent numerous applications, agents, software components, modules, interfaces, controllers, etc., as discussed herein but the application 160 is not meant to be a limitation.

The operating system 150 may control the execution of other computer programs, and provides scheduling, input-output control, file and data management, memory management, and communication control and related services.

The application(s) 160 may employ a service-oriented architecture, which may be a collection of services that communicate with each. Also, the service-oriented architecture allows two or more services to coordinate and/or perform activities (e.g., on behalf of one another). Each interaction between services can be self-contained and loosely coupled, so that each interaction is independent of any other interaction.

Further, the application 160 may be a source program, executable program (object code), script, and/or any other entity comprising a set of instructions to be performed. When a source program, then the program is usually translated via a compiler (such as the compiler 140), assembler, interpreter, or the like, which may or may not be included within the memory 120, so as to operate properly in connection with the O/S 150. Furthermore, the application 160 can be written as (a) an object oriented programming language, which has classes of data and methods, or (b) a procedure programming language, which has routines, subroutines, and/or functions.

The I/O devices 170 may include input devices (or peripherals) such as, for example but not limited to, a mouse, keyboard, scanner, microphone, camera, etc. Furthermore, the I/O devices 170 may also include output devices (or peripherals), for example but not limited to, a printer, display, etc. Finally, the I/O devices 170 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 170 also include components for communicating over various networks, such as the Internet or an intranet. The I/O devices 170 may be connected to and/or communicate with the processor 110 utilizing Bluetooth connections and cables (via, e.g., Universal Serial Bus (USB) ports, serial ports, parallel ports, firewire, HDMI (High-Definition Multimedia Interface), etc.).

When the computer 100 is in operation, the processor 110 is configured to execute software stored within the memory 120, to communicate data to and from the memory 120, and to generally control operations of the computer 100 pursuant to the software. The application 160 and the O/S 150 are read, in whole or in part, by the processor 110, perhaps buffered within the processor 110, and then executed.

When the application 160 is implemented in software it should be noted that the application 160 can be stored on virtually any computer readable medium for use by or in connection with any computer related system or method. In the context of this document, a computer readable medium may be an electronic, magnetic, optical, or other physical device or means that can contain or store a computer program for use by or in connection with a computer related system or method.

The application 160 can be embodied in any computer-readable medium 120 for use by or in connection with an instruction execution system, apparatus, server, or device, such as a computer-based system, processor-containing system, or other system that can fetch the instructions from the instruction execution system, apparatus, or device and execute the instructions. In the context of this document, a "computer-readable medium" can be any means that can store, read, write, communicate, or transport the program for use by or in connection with the instruction execution system, apparatus, or device. The computer readable medium can be, for example but not limited to, an electronic, magnetic, optical, or semiconductor system, apparatus, or device.

More specific examples (a nonexhaustive list) of the computer-readable medium 120 would include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 160 is implemented in hardware, the application 160 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 2:
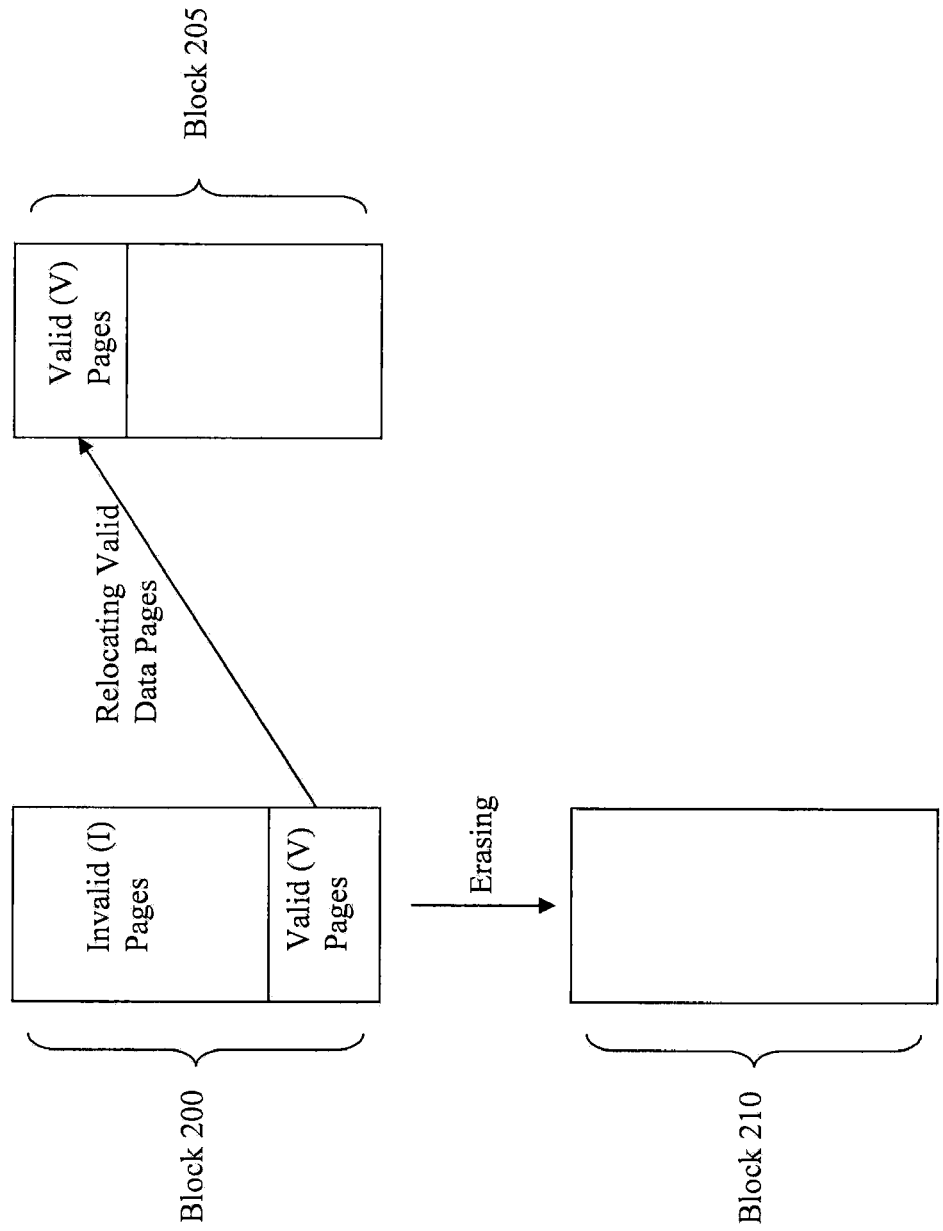
FIG. 2 illustrates an example of write amplification.

Reference is now made to FIG. 2, FIG. 2 illustrates an example of write amplification during, e.g., garbage collection. In block 200, suppose that I pages have been rewritten and hence have been invalidated in block 200 before this block 200 is selected for garbage collection. The block 200 still has V valid pages, where V+I=np, that have to be relocated to another block 205 before the block 200 can be erased and reclaimed. In other words, in order to (re)write I user pages of the block 200, the number of physical pages (np) that have to be written is V+I. Therefore the write amplification (wa) is the following:

$$wa = \frac{V+I}{I} = 1 + \frac{V}{I} \quad \text{Equation (1)}$$

In accordance with exemplary embodiments, a controller can identify dynamic data pages from static ones by utilizing the container marker scheme disclosed herein and place them into separate blocks. Accordingly, the write amplification factor can be significantly reduced. Block 210 represents an erased block that will be available in a free pool of blocks.

Figure 3:
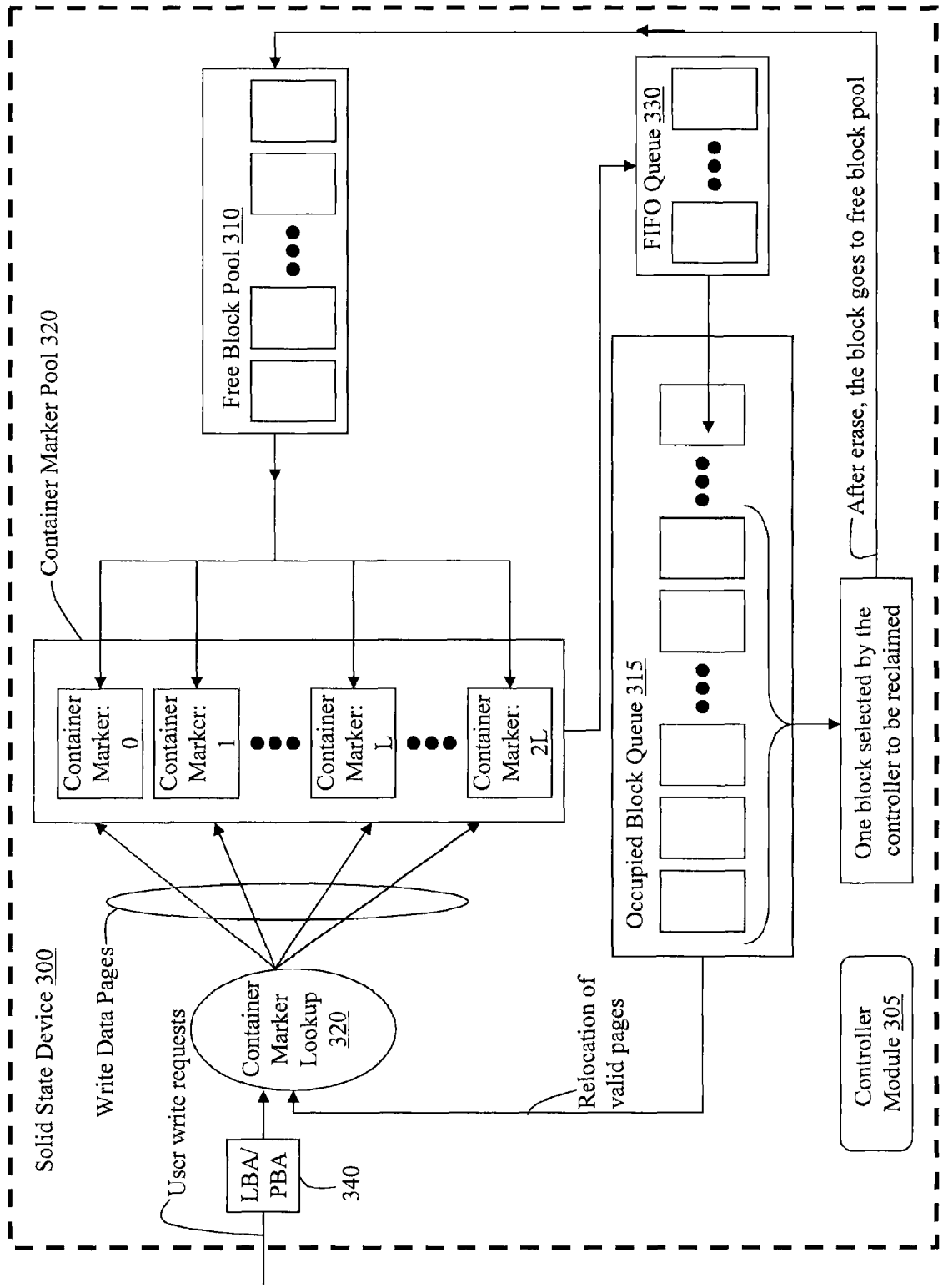
FIG. 3 illustrates a block diagram for a solid state storage device in accordance with exemplary embodiments.

FIG. 3 illustrates a block diagram for a solid state storage device 300 in accordance with exemplary embodiments. The solid state storage device 300 may be implemented, e.g., in the memory 120 of the computer 100. Also, the solid state storage device 300 may be operatively connected to the computer 100.

One or more controllers 305 are configured to manage, control, and operate the solid state storage device 300 in accordance with exemplary embodiments. The controller 305 may be implemented as modules, applications, programs, application specific integrated circuits, etc., and/or a combination thereof. The controller 305 may be in the solid state storage device 300. Also, the controller 305 may be operatively connected to and separate from the solid state storage device 300. The controller 305 is configured to adaptively track the static/dynamic level of data pages, and the controller 305 writes data pages according to their static-dynamic level. For example, the controller 305 is operative to mark each block in use with a container marker level, which indicates the static-dynamic level of all data pages stored on each respective block. For ease of explanation and not limitation, the controller 305 is configured to mark blocks with different container marker levels in a container marker pool 320. It should be noted that the term "block" is not limited to a flash memory block, and the term block may refer to the smallest addressable data unit, which typically has 512 bytes in HDDs. In accordance with exemplary embodiments, the marking of blocks by the controller 305 extends to groups of multiple blocks as a single "container" that holds multiple data pages, in the container marker pool 320. As such, a single container marker level may apply to groups of blocks, where each block contains multiple data pages. In an implementation of exemplary embodiments, the container marker of each block may be stored in DRAM memory (most likely battery-backed or capacitor-protected in case of power failure) indexed by its block identification.

With regard to marking data blocks by the controller 305 in accordance with exemplary embodiments, the terms container marker level, marker, marker level, marks, and/or static-dynamic level may be used interchangeably to indicate the varied degrees of staticness and/or dynamicness of all the data pages on a particular data block. Any designations used herein are for explanation purposes are not meant to be limiting.

A free block pool 310 includes numerous blocks that are available for use to write data pages. Although the container marker pool 320 and the free block pool 310 are separately illustrated for explanation purposes, it is understood that the container marker pool 320 may be integrated with the free block pool 310 or vice versa. The free block pool 310 may be ordered by the block's endurance cycle with the left most block having the least endurance. The free block pool 310 is organized by a priority queue in terms of the blocks' write-erase endurance cycle count, with the youngest blocks appearing on the left. In case the solid state storage device 300 has blocks with different write-erase endurance cycle budgets in terms of the blocks' remaining write-erase endurance cycle count, the youngest blocks are the ones with the largest remaining endurance cycle count in the free block pool 310.

An occupied block queue 315 includes numerous blocks. The blocks in the occupied block queue 315 may contain valid and/or invalid data pages. The controller module 305 is operative to select blocks from the occupied block queue 315 to be erased and reclaimed by the free block pool 310. Optionally, the blocks may enter a first in, first out (FIFO) queue 330 before entering the occupied block queue 305, and/or the FIFO queue 330 may be integrated with the occupied block queue 315.

In exemplary embodiments, the controller 305 is operative to mark the free data blocks from the free block pool 310 with all types of container maker levels. For example, the controller 305 is configured to mark blocks of the container marker pool 320 to hold user write requests from a user utilizing the computer 100 and relocation write requests from the occupied block queue 315, with each block being marked with a container marker level 0, 1, 2 ..., L ... 2L. For example, the controller 305 is configured to mark the blocks in the container marker pool 320 with a container marker level having a numbering from 0 to 2L, with 0 indicating the most static level, 2L indicating the most dynamic level, and L indicating a neutral level. It is understood that the marking levels described in the present disclosure are for explanation purposes and other marking levels may be utilized in accordance with exemplary embodiments.

Figure 4:
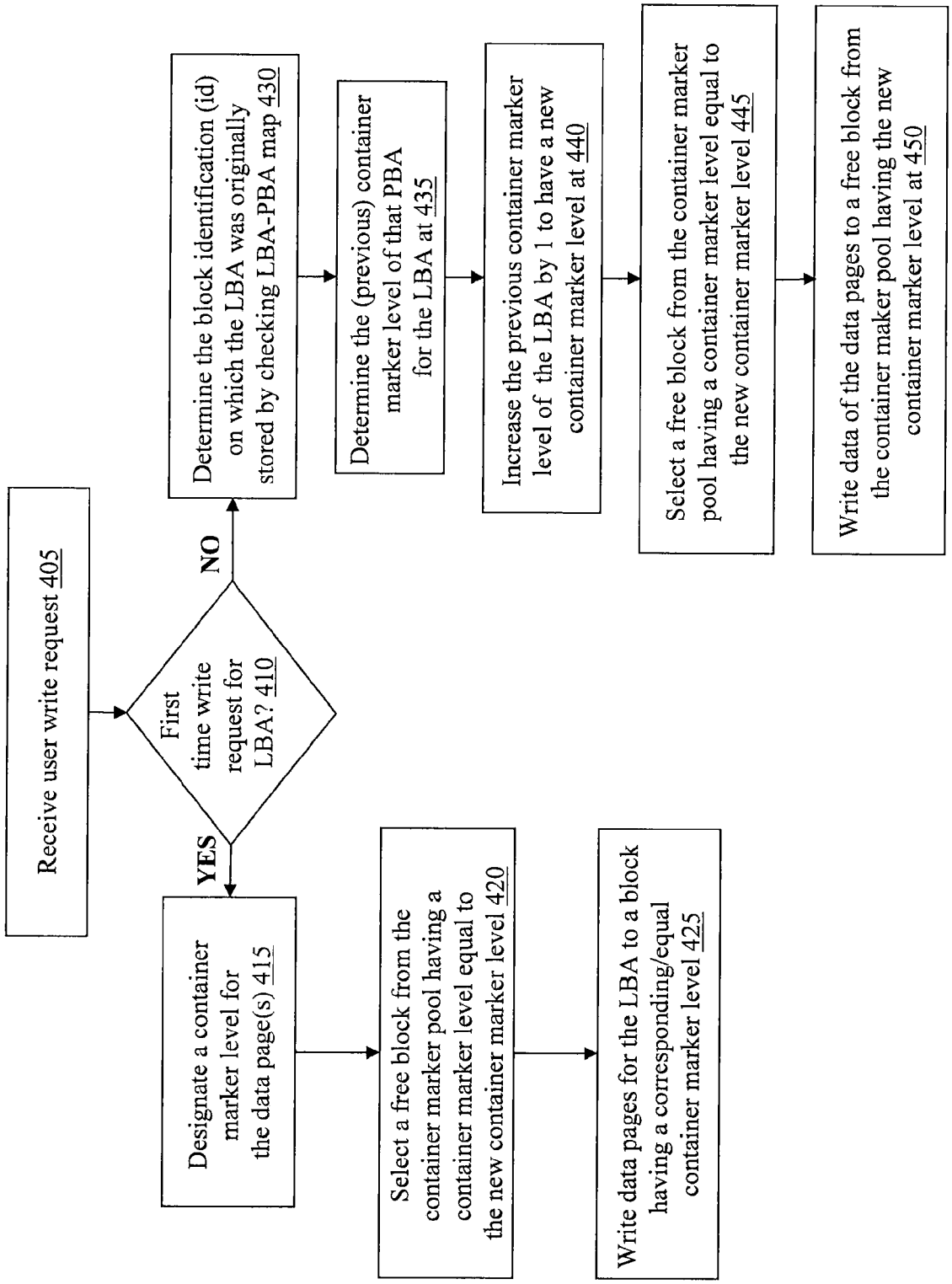
FIG. 4 illustrates a method for a user write request in accordance with exemplary embodiments.

With reference to FIG. 3 and FIG. 4, FIG. 4 illustrates a method for a user write request in accordance with exemplary embodiments. The controller 305 is operative to receive a user write request from a user, e.g., executing a save command on the computer 100 at 405.

For each user write request of a data page, the controller 305 is operative check whether the write request is addressed to a logical block address (LBA) that is being written for the first time or not at 410. For example, the controller 305 is operative to perform a look up in a LBA-PBA map 340 to determine if there is a physical block address (PBA) on the solid state storage device 300 that corresponds to the logical block address that is being written to.

If the LBA is written for the first time, e.g., there is no valid LBA-PBA map entry in the LBA-PBA map 340 for that LBA, the controller 305 is operative to designate a static-dynamic level of that LBA as having, e.g., a new container marker level of L (which is neutral in terms of dynamicity) at 415. Optionally, in exemplary embodiment, the controller 305 may be configured to designate the marker level for the LBA as a new container marker level of any other value, and it is understood by one skilled in the art that the initial designation of the new container marker level is a design choice.

The controller 305 is operative to select a free block from the container marker pool 320 (from the free block pool 310) with the appropriate container marker level equal to the new container marker level L at 420. There may be numerous blocks in the container marker pool 320 in which some are being designated with a container marker level by the controller 305 and/or others have already been designated with a container marker level by the controller 305.

The controller 305 is operative to write the data pages for the LBA to the free block having the container marker level of L in the container marker pool 320 at 425. For example, the controller 305 is operative to provide container marker level designations for each block in the container marker pool 310. In response to the controller 305 determining that the container marker level is L for the LBA of the user request, the controller 305 selects a block from the container marker pool 320 and writes the data of the user request to data pages of the block designated with the container maker level L. The block designated with the container marker level L may already have other data pages contained therein, and in accordance with exemplary embodiments, those data pages would all correspond to the container marker level L. For explanation purposes, the container marker level 2L is considered the highest dynamic level.

Now, if the case is that the LBA has been written before, meaning that the user write request is actually an update request, then the flash controller 305 is operative to determine the block identification (id), (by looking at the PBA), on which the LBA was originally stored by checking LBA-PBA map 340 at 430. From the block id, the controller knows the container marker of that block.

With the block id, by utilizing the container marker lookup 320, the controller 305 is operative to determine the (previous) container marker level of that physical block address for the LBA, which is an estimation of the previous static-dynamic level of the LBA for the user request at 435.

With the previous container marker level that corresponds to the LBA of the user request, the controller 305 is operative to increase the previous container marker level of the LBA by 1 (and/or more) to have a new container marker level for the LBA at 440.

The controller 305 is operative to select a free block from the container marker pool 320 (from the free block pool 310) with the appropriate container marker level equal to the new container marker level for the LBA at 445.

The controller 305 is operative to write data of the data pages to the free block from the container maker pool 320 having the new (current) container marker level (which is equal to the previous container marker level of the LBA increased to 1 higher container marker level) at 450.

The following provides a process of the controller 305 for determining the new container marker for the LBA:

For explanation purposes, the controller 305 may denote the container marker of the LBA's previous block as u, and choose to store this LBA to a block with a container marker u', where normally u'≧u. For instance, the controller 305 is operative to determine whether $$u' = \begin{cases} u+1 & \text{if } u < 2L \\ 2L & \text{otherwise} \end{cases} \quad \text{Equation (2)}$$

Note that u' is the new container marker for the LBA. The controller 305 is operative to store the data for the LBA in a free block having the new container marker u' in accordance with the determination of Equation (2) in exemplary embodiments.

Figure 5:
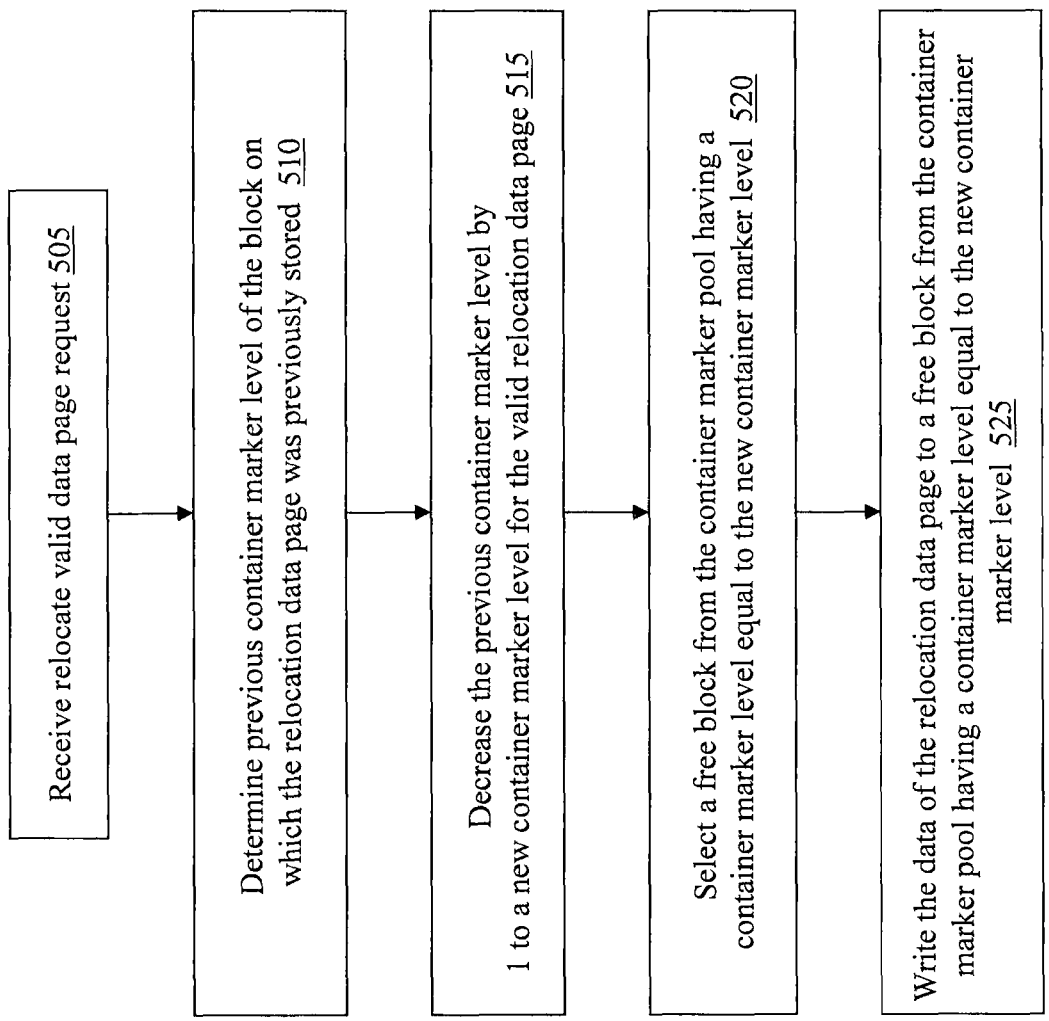
FIG. 5 illustrates a method for a relocation write request in accordance with exemplary embodiments.

With reference to FIG. 3 and FIG. 5, FIG. 5 illustrates a method for a relocation write request of data in blocks from the occupied block queue 315 in accordance with exemplary embodiments.

The controller 305 is operative to receive a relocate valid data page write request at 505.

For each valid data page relocation write request, the controller is operative to (first) check the previous (static-dynamic level, r) container marker level by reading the container marker associated with the block on which the relocation data page was previously stored at 510.

The controller 305 is operative to decrease the previous container marker level by 1 (and/or more) to a new (current) container marker level for the valid relocation data page at 515. For example, if the previous container marker level is 1, then the new container marker level is the previous container marker level minus 1 container marker level, which results in the new container marker level of 0. If the previous container marker level is 0, which is the lowest container marker level (indicating the highest static level), then the new container marker level is also 0 for the relocation valid data page.

The controller 305 is operative to select a free block from the container marker pool 320 having a container marker level equal to the new container marker level at 520.

The controller 305 is operative to write the data of the relocation data page to a free block from the container marker pool 320 having a container marker level equal to the new container marker level at 525.

The following provides a process of the controller 305 for determining the new container marker for the valid data page in accordance with exemplary embodiments. For explanation purposes, the controller 305 may denote previous (static-dynamic level) container marker level as r. The controller 305 may choose to store the valid data page needing to be relocated to a block with a container marker r', where normally r'≦r, indicating a decrease in the valid data page's dynamic level. For instance, the controller 305 is operative to determine whether $$r' = \begin{cases} r-1 & \text{if } r > 0 \\ 0 & \text{otherwise} \end{cases} \quad \text{Equation (3)}$$

The disclosed container marker scheme provides a good level of adaptability to any changing workloads, thus leading to an accurate estimation of dynamic level of all the data pages without huge computational cost. Based on the container marker scheme of exemplary embodiments, the controller 305 is operative to aggregate data pages of similar dynamic level and put them together in the same block. In particular, when most dynamic data pages are stored together in one block, the garbage collection, even if only partially based on a greedy policy, can improve cleaning efficiency, therefore leading to a write reduction through reducing the write amplification factor.

Figure 6:
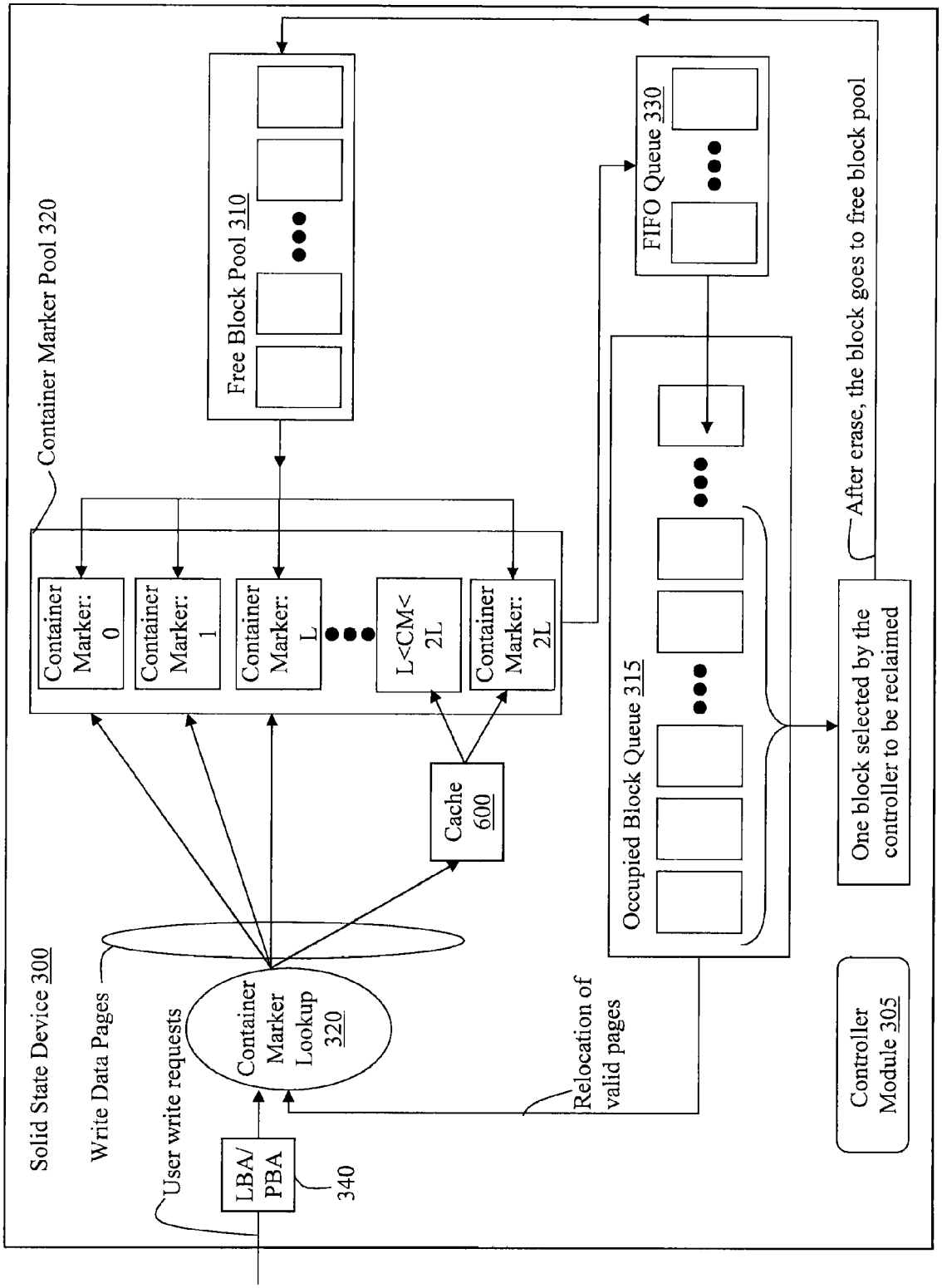
FIG. 6 illustrates a block diagram depicting utilization of a write cache for write reduction in conjunction with a container marker scheme in accordance with exemplary embodiments.

FIG. 6 illustrates a block diagram depicting utilization of a write cache 600 for write reduction in conjunction with the container marker scheme in accordance with exemplary embodiments. Unlike the block diagram of FIG. 3, the write cache 600 is now illustrated in the solid state storage device 300 in FIG. 6.

Exemplary embodiments utilizing the write cache 600 design exploit the container marker scheme described herein and a variant of a de-dup algorithm. Exemplary embodiments make the write cache 600 effective for write reduction by the controller 305 determining the most frequently updated data pages and putting them into the write cache 600, and the container marker scheme provides a good estimation of such information.

In one implementation of exemplary embodiments, the controller 305 is operative to store data pages with a dynamic level larger than a threshold in the write cache 600. In exemplary embodiments, repeated writes of data pages will be absorbed over time and will not be written to the memory of the solid state drive (e.g., flash memory). For example, instead of the controller 305 writing data pages having a container marker level of 2L (and/or greater than L) to a block from the free block pool 310 that has been designated with a container marker level 2L in the container marker pool 320, the controller 305 is operative to write the data pages to the write cache 600.

The write cache 600 will be managed regularly by the controller 305 to prevent repeated writes to the blocks and to de-stage data pages that have relatively low dynamic level, such as pages below a certain threshold. For example, the data pages may need to be marked above the container marker level L and/or the data pages may be marked with the container marker level 2L.

The write cache 600 may be implemented by, e.g., battery-backed or capacitor-backed DRAM, which has a much limited size compared to the capacity of flash memory. Compression techniques may be utilized to efficiently use the limited space of the write cache 600. The controller 305 can apply conventional lossless compression techniques, such as LZW, gzip, bzip, etc., directly to the data pages before being stored in the write cache 600. Alternatively and/or additionally, exemplary embodiments provide a de-dup algorithm of the controller 305 to reduce the DRAM space requirement for each single data page stored in the write cache 600.

For example, when a data page is about to be stored in the write cache 600, the controller 305 is operative to (first) read the old version stored of the data page on the block (e.g., of the flash memory), and the controller 305 is operative to apply a de-dup algorithm to compute a difference between the new version (which is the current write request) and the old version previously stored on the block (with a container marker level). The controller 305 is operative to store the difference and/or a compressed version of the difference in the write cache 600. The read and compare scheme of the controller 305 works well for frequently updated data pages (designated by the container marker level) as the cost (time) of reading a data page from flash memory is much smaller than a write operation.

There are several existing de-dup algorithms. The most simple and straight-forward is byte-by-byte or bit-by-bit differing algorithms; however, these might experience a severe problem due to boundary misalignment, which happens quite often with insertion and/or deletion operations on data pages. Exemplary embodiments provide the use of a variant of the de-dup algorithm in the controller 305. Exemplary embodiments describe the algorithm as follows. Suppose there are two versions of a data page at processing: one is the old version already stored in a block (of flash memory) and one is the updated version in the buffer (the buffer is not shown but one skilled in the art understands buffering in relation to solid state devices). The controller 305 does not store the updated version in the write cache 600; instead the controller 305 is operative to store only the (compressed) difference between the old version and the updated version.

For explanation purposes, the controller 305 may denote the data page size in bytes by p which is the term seed that refers to a consecutive sequence of data bytes, and the send size is s, where s<p. The controller 305 is operative to apply a modular hash function over every seed of a data page, cycling through the beginning till the end, to compute k distinguishing characteristics of both versions of the data page. The reason for using the modular hash function is mainly because of its low computational cost. More specifically, the k distinguishing characteristics may be computed as follows:

(1) calculate a hash value for every seed of both versions. In a non-limiting exemplary embodiment, the hash value for every seed may be calculated using a rolling hash function which moves forward in each iteration by one byte.

(2) Next, for each version of the data page, the k maximum hash values of respective k seeds, are selected from all calculated hash values. The k seeds corresponding to the k maximum hash values constitute the k maximum seeds. Thereafter, the k hash values of respective k seeds that follow by one byte (and overlap by s−1 bytes), the k maximum seeds, respectively, are selected as the k distinguishing characteristics for each version of data page. In accordance with exemplary embodiments, it can be shown that the k distinguish characteristics, of each version of the data page, are uniformly distributed in the hashing space.

The k distinguish characteristics are then used as anchors to align the two versions (updated version and old version) of the data page, and then compute the difference of the two versions by the controller 305. It should be noted that the above de-dup-based method of exemplary embodiments can be employed alone and/or combination with other compression methods. For instance, the controller 305 may first apply a conventional compression scheme like gzip, bzip, etc., apply the disclosed de-dup algorithm of exemplary embodiments in parallel, and select the one which yields the least DRAM requirement. This can improve the effectiveness of the write cache 600 by including more complexity.

Figure 7:
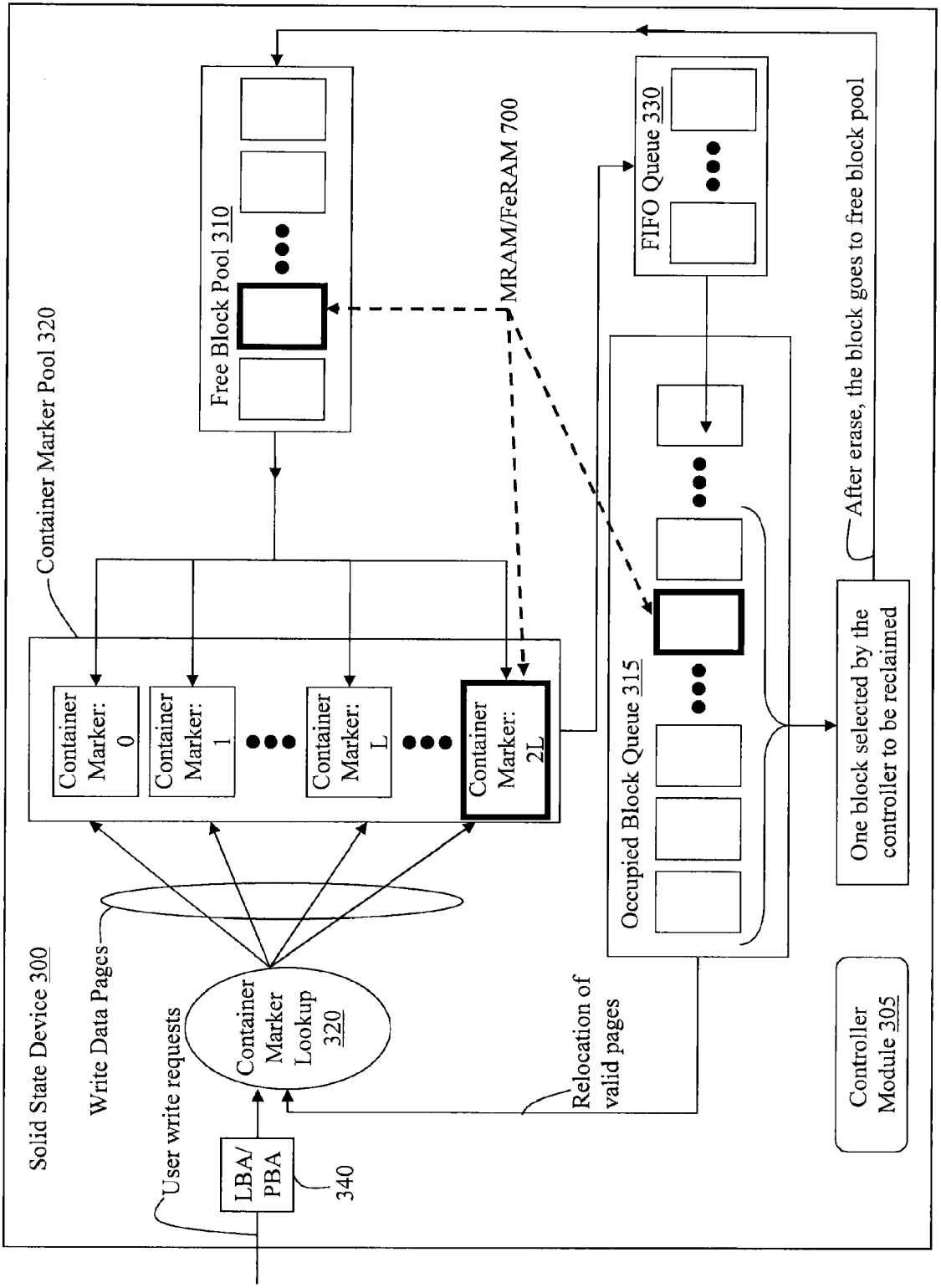
FIG. 7 illustrates an example of utilizing MRAM and/or FeRAM to improve endurance in conjunction with a container marker scheme in accordance with exemplary embodiments.

FIG. 7 illustrates an example of utilizing magnetoresistive random access memory (MRAM) and/or ferroelectric RAM (FeRAM or FRAM) to improve endurance in accordance with exemplary embodiments. MRAM and/or FeRAM chips are nonvolatile and have no endurance issues. The container marker scheme can be applied to facilitate and improve the use of MRAM and/or FeRAM chips. In order to utilize MRAM and/or FeRAM in a cost effective way, e.g., in a flash-dominated solid state drive device, the controller 305 is operative to store the most frequently updated data pages, which are identified by the container marker scheme, on MRAM and/or FeRAM. By this way, the MRAM and/or FeRAM is more frequently being written and erased than flash memory. As such, this technique can significantly improve the endurance lifetime of the solid state device 300.

In FIG. 7, the MRAM and/or FeRAM chips are shown as blocks 700 in the free block pool 310, the occupied block queue 315, and the container marker pool 320. Namely, the controller 305 is operative to place data pages with a high dynamic level into MRAM and/or FeRAM 700, and other data pages into flash memory chips. Since the data pages on the MRAM and/or FeRAM 700 are more dynamic, thus tending to be invalidated faster, these MRAM and/or FeRAM 700 chips consequently will be used more than flash chips, which in the end improves the overall endurance.

In accordance with exemplary embodiments, the container marker scheme improves the efficiency of garbage collection which eventually leads to lower write amplification. As discussed herein, the container marker is a numbering marker attached to each block that holds data pages. The marker is an indicator of how frequently a data page is updated and/or changed.

Magnetoresistive Random Access Memory (MRAM) is a non-volatile computer memory (NVRAM) technology. MRAM has similar performance to SRAM, similar density of DRAM but much lower power consumption than DRAM, and is much faster and suffers no degradation over time in comparison to flash memory. Its main disadvantage compared to flash memory is higher cost. Ferroelectric RAM (FeRAM or FRAM) is a random access memory similar in construction to DRAM but uses a ferro electric layer instead of a dielectric layer to achieve non-volatility. The advantages of FeRAM over flash include lower power usage, faster write performance and a much greater maximum number (exceeding 1016 for 3.3 V devices) of write-erase cycles. FeRAM disadvantages are much lower storage densities than flash devices, storage capacity limitations, and higher cost.

Figure 8:
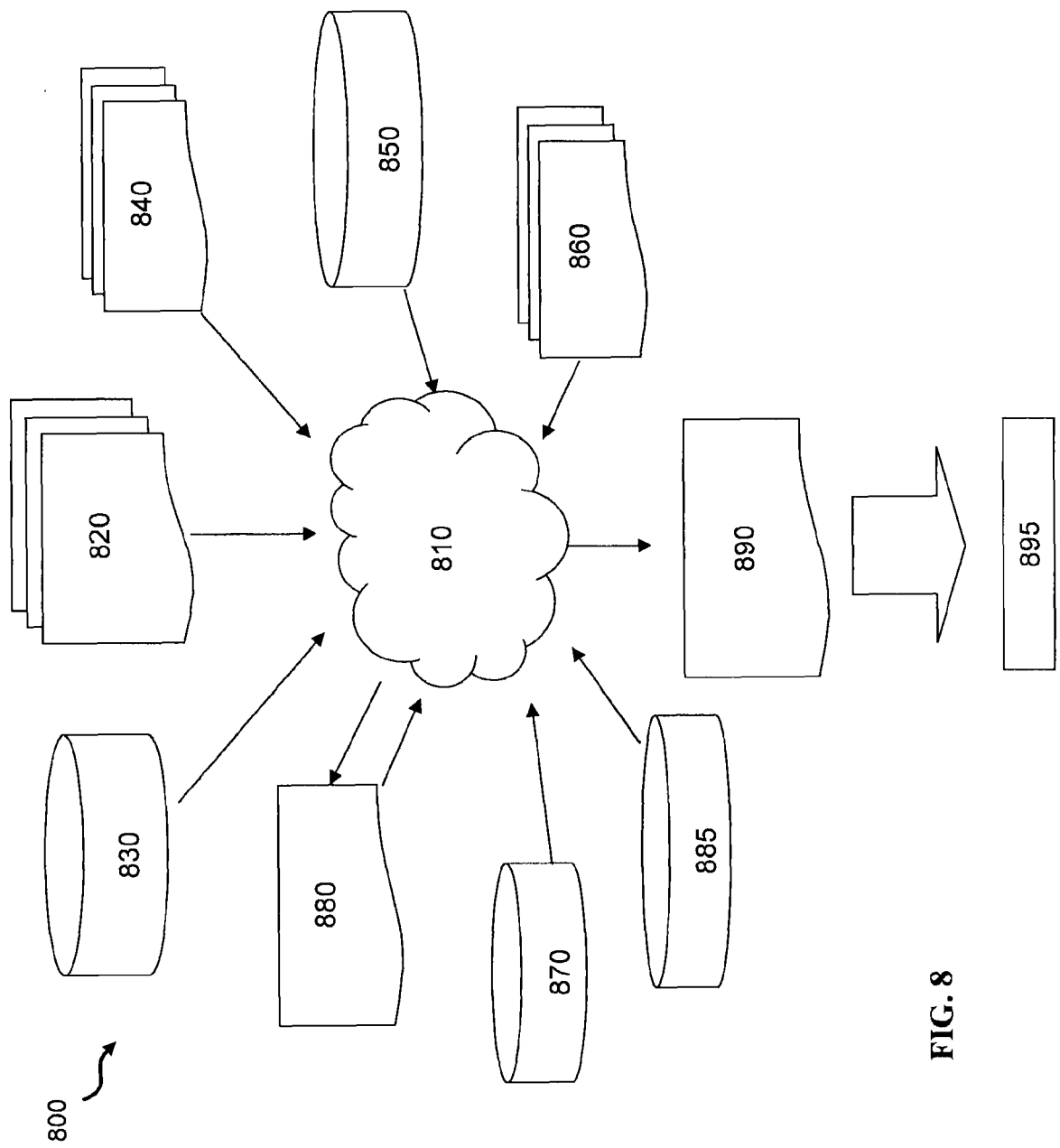
FIG. 8 shows a block diagram of an exemplary design flow which can be utilized in semiconductor IC logic design, simulation, test, layout, and/or manufacture.

FIG. 8 shows a block diagram of an exemplary design flow 800 used for example, in semiconductor IC logic design, simulation, test, layout, and manufacture. Design flow 800 includes processes, machines and/or mechanisms for processing design structures or devices to generate logically or otherwise functionally equivalent representations of the design structures and/or devices described above and shown in FIGS. 3, 6, and 7. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in FIGS. 3, 6, and 7. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 3, 6, and 7 to generate a netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 810 without deviating from the scope and spirit of the invention. Design process 810 may also include modules for performing standard circuit design processes such as timing analysis, verification, design rule checking, place and route operations, etc. Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3, 6, and 7. In one embodiment, design structure 890 may comprise a compiled, executable HDL simulation model that functionally simulates the devices shown in FIGS. 3, 6, and 7.

Design structure 890 may also employ a data format used for the exchange of layout data of integrated circuits and/or symbolic data format (e.g. information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3, 6, and 7. Design structure 890 may then proceed to a stage 895 where, for example, design structure 890: proceeds to tape-out, is released to manufacturing, is released to a mask house, is sent to another design house, is sent back to the customer, etc.

Further, it is understood that the computer 600 includes non-limiting examples of software and hardware components that may be included in and utilized with various devices, servers, and systems discussed herein, and it is understood that additional software and hardware components may be included in the various devices and systems discussed in exemplary embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A solid state storage device, comprising:
 a plurality of blocks configured as storage memory for a solid state storage device, each block comprising a plurality of data pages; and
 a controller comprising integrated circuits configured to operate the solid state storage device;
 wherein a free block of the plurality of blocks is assigned an integer number being a marker level by the controller;

wherein, for a particular data page of the plurality of data pages, each particular data page is written to a block of the plurality of blocks with the marker level corresponding to a level of dynamicity calculated by the controller for that particular data page;

wherein the marker level of the block indicates the dynamicity, being the frequency of being updated, of all data pages stored on that block; and wherein the data pages of a same dynamicity are placed together;

wherein, when a valid data page is to be relocated from an occupied block to a new block, the controller is configured to:

denote a previous marker level for the valid data page as r and a new marker level for the valid data page as r';

determine that the valid data page is stored in the new block corresponding to the new marker level r'=r−1 when r>0, where 0 is a highest static level; and determine that the valid data page is stored in the new block corresponding to the new marker level r'=0 in any case when r>0 is not true.

2. A solid state storage device, comprising:

a plurality of blocks configured as storage memory for a solid state storage device; and a controller comprising integrated circuits configured to operate the solid state storage device;

wherein when writing data addressed to a logical block address, the controller is operative to:

determine a previous marker level for the logical block address; and write the data to a free block of the plurality of blocks, the free block having a marker level of the previous marker level increased by 1 or more;

wherein, when a valid data page is to be relocated from an occupied block to a new block, the controller is configured to:

denote a previous marker level for the valid data page as r and a new marker level for the valid data page as r';

determine that the valid data page is stored in the new block corresponding to the new marker level r'=r−1 when r>0, where 0 is a highest static level; and determine that the valid data page is stored in the new block corresponding to the new marker level r'=0 in any case when r>0 is not true.

3. The device of claim 2, wherein the controller is operative to mark each of the plurality of blocks with a marker level ranging from highly static to highly dynamic in two or more levels.

4. The device of claim 2, wherein the controller is operative to write data pages to blocks of the plurality of blocks based on a respective marker level for each data page.

5. The device of claim 2, wherein the controller is operative to write data pages most frequently updated to blocks of the plurality of blocks having a highest dynamic marker level.

6. The device of claim 2, wherein the controller is operative to write pages least frequently updated to blocks of the plurality of blocks having a highest static maker level.

7. The device of claim 2, wherein the controller is operative to cause blocks of the plurality of blocks having a highest dynamic marker level to have more invalid data pages than blocks of the plurality of blocks having a highest static marker level.

8. The device of claim 2, wherein when writing data that has no previous marker level, the controller is operative to write the data to a block of the plurality of blocks having a middle marker level.

9. The device of claim 2, wherein when continuously receiving the write request addressed to the logical block address, the controller is operative to:

continuously increase the previous marker level by 1; and determine the free block of the plurality of blocks having a marker level equal to the continuously increased previous marker level; and wherein in response to continuously receiving the write request addressed to the logical block address, the controller is operative to write the data to the free block of the plurality of blocks having the marker level equal to the continuously increased previous marker level.

10. The device of claim 9, wherein the controller is operative to continuously increase the previous marker level by 1 until a highest dynamic marker level is reached, wherein in response to the previous marker level reaching the highest dynamic marker level, the controller is operative to write the data to the free block of the plurality of blocks having the highest dynamic marker level.

11. The device of claim 2, wherein in response to the controller determining that the previous marker level for the logical block address is a highest marker level, the controller is operative to:

determine the difference between a current data page for the logical block address and a previous data page for the logical block address; and write data of the difference between the current data page and the previous data page to a cache.

12. The device of claim 2, wherein in response to the controller determining that the previous marker level for the logical block address is a relatively high marker level, the controller is operative to write the data to a free block of the plurality of blocks which corresponds to at least one of a magnetoresistive random access memory and ferroelectric random access memory.

13. A solid state storage device, comprising:

a plurality of blocks configured as memory for a solid state storage device; and a controller comprising integrated circuits configured to operate the solid state storage device;

wherein performing a write request to relocate valid data pages of a block of the plurality of blocks, the controller is operative to:

determine a previous marker level for the block of the plurality of blocks; and write the valid data pages to a free block of the plurality of blocks, the free block having a marker level of the previous marker level decreased by 1 or more;

wherein, when a valid data page is to be relocated from an occupied block to a new block, the controller is configured to:

denote a previous marker level for the valid data page as r and a new marker level for the valid data page as r';

determine that the valid data page is stored in the new block corresponding to the new marker level r'=r−1 when r>0, where 0 is a highest static level; and determine that the valid data page is stored in the new block corresponding to the new marker level r'=0 in any case when r>0 is not true.

14. The drive of claim 13, wherein the controller is operative to mark each of the plurality of blocks with a marker level ranging from highly static to highly dynamic in two or more levels.

15. The device of claim 13, wherein the controller is operative to write the valid data pages to blocks of the plurality of blocks based on a respective marker level for each valid data page.

16. The device of claim 13, wherein the controller is operative to write valid pages least frequently updated to blocks of the plurality of blocks having a highest static maker level.

17. The device of claim 13, wherein the controller is operative to cause blocks of the plurality of blocks having a highest dynamic marker level to have more invalid data pages than blocks of the plurality of blocks having a highest static marker level.

18. The device of claim 13, wherein when continuously receiving the write request to relocate the valid data pages for the block of the plurality of blocks, the controller is operative to:
   continuously decrease the previous marker level for the block of the plurality of blocks; and
   determine the free block of the plurality of blocks having a marker level equal to the continuously decreased previous marker level; and
   wherein in response to continuously receiving the write request to relocate the valid data pages for the block of the plurality of blocks, the controller is operative to write the valid data pages to the free block of the plurality of blocks having the marker level equal to the continuously decreased previous marker level.

19. The device of claim 18, wherein the controller is operative to continuously decrease the previous marker level by 1 until a highest static marker level is reached,
   wherein in response to the previous marker level reaching the highest static marker level, the controller is operative to write the valid data pages to the free block of the plurality of blocks having the highest static marker level.

20. A method for a marking scheme in a solid state storage device, comprising:
   receiving a request to write data addressed to a logical block address of the solid state storage device of a computer, the solid state storage drive having a plurality of blocks configured as memory, wherein a controller is configured to operate the solid state storage device;
   determining a previous marker level for the logical block address; and
   writing the data to a free block of the plurality of blocks, the free block having a marker level of the previous marker level increased by 1 or more;
   wherein, when a valid data page is to be relocated from an occupied block to a new block, the controller is configured to:
      denote a previous marker level for the valid data page as r and a new marker level for the valid data page as r';
      determine that the valid data page is stored in the new block corresponding to the new marker level r'=r−1 when r>0, where 0 is a highest static level; and
      determine that the valid data page is stored in the new block corresponding to the new marker level r'=0 in any case when r>0 is not true.

21. The method of claim 20, further comprising:
   when continuously receiving the write request addressed to the logical block address, continuously increasing the previous marker level by 1;
   determining the free block of the plurality of blocks having a marker level equal to the continuously increased previous marker level; and
   in response to continuously receiving the write request addressed to the logical block address, writing the data to the free block of the plurality of blocks having the marker level equal to the continuously increased previous marker level.

22. A method for a marking scheme in a solid state storage device, comprising:
   receiving a write request to relocate valid data pages of a block of a plurality of blocks of the solid state storage device of a computer, the solid state storage device having the plurality of blocks configured as memory, wherein a controller is configured to operate the solid state storage device;
   determining a previous marker level for the block of the plurality of blocks; and
   writing the valid data pages to a free block of the plurality of blocks, the free block having a marker level of the previous marker level decreased by 1 or more;
   wherein, when a valid data page is to be relocated from an occupied block to a new block, the controller is configured to:
      denote a previous marker level for the valid data page as r and a new marker level for the valid data page as r';
      determine that the valid data page is stored in the new block corresponding to the new marker level r'=r−1 when r>0, where 0 is a highest static level; and
      determine that the valid data page is stored in the new block corresponding to the new marker level r'=0 in any case when r>0 is not true.

23. The method of claim 22, further comprising:
   when continuously receiving the write request to relocate the valid data pages for the block of the plurality of blocks, continuously decreasing the previous marker level for the block of the plurality of blocks;
   determining the free block of the plurality of blocks having a marker level equal to the continuously decreased previous marker level; and
   in response to continuously receiving the write request to relocate the valid data pages for the block of the plurality of blocks, writing the valid data pages to the free block of the plurality of blocks having the marker level equal to the continuously decreased previous marker level.

24. A solid state storage device, comprising:
   a plurality of blocks configured as storage memory for a solid state storage device, each block comprising a plurality of data pages; and
   a controller comprising integrated circuits configured to operate the solid storage device;
   wherein a data placement scheme is implemented by the controller, such that data pages with a similar update frequency, being a dynamicity, are grouped and written to a same block, and each block has a marker indicating the dynamicity of the data pages stored on the block;
   wherein the controller maintains the marker for each block in a dynamic random access memory (DRAM) or stores the marker on the block;
   wherein, when a valid data page is to be relocated from an occupied block to a new block, the controller is configured to:
      denote a previous marker level for the valid data page as r and a new marker level for the valid data page as r';
      determine that the valid data page is stored in the new block corresponding to the new marker level r'=r−1 when r>0, where 0 is a highest static level; and
      determine that the valid data page is stored in the new block corresponding to the new marker level r'=0 in any case when r>0 is not true.

* * * * *